United States Patent [19]

Kemmer et al.

[11] Patent Number: 4,837,607
[45] Date of Patent: Jun. 6, 1989

[54] LARGE-AREA, LOW CAPACITANCE SEMICONDUCTOR ARRANGEMENT

[76] Inventors: Josef Kemmer, Hauptstr. 41 D, 8048 Haimhausen; Gerhard Lutz, Therese-Giese-Allee 23, 8000 Munchen 83, both of Fed. Rep. of Germany

[21] Appl. No.: 828,307
[22] PCT Filed: Apr. 25, 1985
[86] PCT No.: PCT/DE85/00134
§ 371 Date: Feb. 24, 1986
§ 102(e) Date: Feb. 24, 1986
[87] PCT Pub. No.: WO85/04987
PCT Pub. Date: Nov. 7, 1985

[30] Foreign Application Priority Data

Apr. 25, 1984 [DE] Fed. Rep. of Germany ....... 3415439
Mar. 5, 1985 [DE] Fed. Rep. of Germany ....... 3507763

[51] Int. Cl.$^4$ .............................................. H01L 27/14
[52] U.S. Cl. ............................................ 357/30; 357/24; 357/29; 250/338.4; 250/338.1; 250/370.01
[58] Field of Search ............... 357/24 LR, 30 R, 30 I, 357/30 C, 29; 250/336.1, 338, 354.1, 372, 370, 211 J, 338.1, 338.4, 341, 334

[56] References Cited

U.S. PATENT DOCUMENTS

| | | | |
|---|---|---|---|
| 3,832,732 | 8/1974 | Roberts | 357/19 X |
| 3,898,686 | 8/1975 | Conradi | 357/30 |
| 3,949,223 | 4/1976 | Schmit et al. | 357/30 X |
| 4,133,698 | 1/1979 | Chiang et al. | 357/20 X |
| 4,157,559 | 6/1979 | Hall | 357/30 |
| 4,231,052 | 10/1980 | Day et al. | 357/30 X |
| 4,243,885 | 1/1981 | Agouridis et al. | 357/30 X |
| 4,266,234 | 5/1981 | Hornbeck et al. | 357/30 X |
| 4,340,899 | 7/1982 | Husimi et al. | 357/30 X |
| 4,467,201 | 8/1984 | Blackburn et al. | 357/30 X |
| 4,472,728 | 9/1984 | Grant et al. | 357/30 |
| 4,481,522 | 11/1984 | Jastrzebski et al. | 357/24 |
| 4,482,807 | 11/1984 | Blackburn et al. | 357/24 |
| 4,527,182 | 7/1985 | Ishihara et al. | 357/30 R X |
| 4,594,604 | 6/1986 | Kub | 357/30 R X |
| 4,605,946 | 8/1986 | Robinson, Jr. | 357/30 I X |
| 4,613,895 | 9/1986 | Burkey et al. | 357/24 X |
| 4,626,884 | 12/1986 | Shannon | 357/30 R |
| 4,649,408 | 3/1987 | Sekine et al. | 357/30 R X |
| 4,654,678 | 3/1987 | Lightstone et al. | 357/30 R X |
| 4,679,063 | 7/1987 | White | 357/30 |
| 4,684,968 | 8/1987 | Ohta et al. | 357/30 I |
| 4,686,554 | 8/1987 | Ohmi et al. | 357/30 |

OTHER PUBLICATIONS

Gatti et al., "Semiconductor Drift Chamber-An Application of a Novel Charge Transport Scheme", presented at 2nd PISA Meeting on Advanced Detectors, Italy, Jun. 3-7, 1983.

*Primary Examiner*—Nelson Moskowitz
*Assistant Examiner*—John B. Sotomayor
*Attorney, Agent, or Firm*—Barnes & Thornburg

[57] ABSTRACT

A description is given of a semiconductor detector with a low capacitance for detecting radiation and particles having a semiconductor body of a first conductivity type, to which is applied at least one collecting electrode for the majority carriers. Regions of a second conductivity type are provided on the two main surfaces of the semiconductor body and with the latter form depletion layers biased in such a way that the semiconductor body is substantially completely depleted of majority carriers and in the semiconductor body a potential gradient is present, through which flow to the collecting electrode the majority carriers produced by the radiation.

An embodiment of the invention is characterized in that, on one of the two main surfaces between the regions of the second conductivity type are provided zones of the first conductivity type which are reverse biased compared with the regions of the second conductivity type and on the other main surface is provided a large-area region of the second conductivity type with a low surface resistance.

Another embodiment of the invention is characterized in that, on at least one of the two main surfaces between the regions of the second conductivity type are provided zones of the first conductivity type which are reverse biased compared with regions of the second conductivity type and that external voltages are only applied to zones or regions on one main surface.

12 Claims, 6 Drawing Sheets

LARGE-AREA, LOW CAPACITANCE SEMICONDUCTOR ARRANGEMENT

TECHNICAL FIELD

The present invention relates to a large-area, low capacitance semiconductor arrangement 2.

Such a semiconductor arrangement can, for example, be used as a large-area radiation detector for charged particle radiation, γ-radiation, X-radiation or light with wavelengths from the UV to the infrared.

BACKGROUND ART

A low capacitance semiconductor arrangement is, for example, known from publication No. 33,523 of the Brookhaven National Laboratory. However, this arrangement requires the application of clearly defined potential gradients to both sides. As a result of these potential gradients the semiconductor body is completely depleted and the necessary transverse drift field for the majority carriers is produced, for example, by the electrons in the case of n-conducting basic bodies.

In this known low capacitance semiconductor arrangement the minority carriers, for example the holes, are not used as an information source.

In the case of large-area arrangements, e.g. those having a sensitive surface of several $cm^2$, this arrangement is not practicable due to the necessary structuring and due to the very long drift path of the electrons, leading to a reduction in the count rate.

DISCLOSURE OF THE INVENTION

The problem solved by the present invention is to so further develop a semiconductor arrangement that, while retaining low capacitance and with a comparatively low technical expenditure, it is possible to achieve short drift times of the electrons even in the case of large surfaces.

In accord with the present invention the semiconductor body, which may be of the n-type, is provided on one main surface with a large-area region of a second conductivity type, e.g. a $p^+$ region, through which the radiation to be detected enters thereby defining an entrance aperture. On the other main surface are provided alternating regions of the second conductivity type and depletion regions of the first conductivity type, for example $p^+$ and $n^+$ regions, a reverse bias being applied to the $n^+$ regions.

This arrangement leads to a curved configuration of the potential minimum for the majority carriers from one depletion region of the first conductivity type to the next. As a result the drift times of the electrons are significantly reduced and consequently the possible count rates are increased.

This arrangemnt has the advantage that the photolithography during production is greatly simplified, because there is no need to precisely adjust the masks for the front and rear surfaces.

A particularly simple construction of the invention is in the situation where voltages are only applied to a few selected regions of the second conductivity type of a main surface, as well as to zones of the first conductivity type provided on the same main surface. The regions of the second conductivity type on the surface facing this main surface, as well as the further regions of the second conductivity type, possibly on the main surface, in which the connected regions are provided, are automatically set to potentials between the potential of the zones of the first conductivity type and the potential of the connected regions of the second conductivity type. The potential minimum or potential trough is almost in contact with the unconnected main surface.

This obviates all contacting measures on a main surface, so that an easily produced detector is still obtained if there are numerous regions of the second conductivity type in both main surfaces. Moreover, the incident particle flow is not influenced by contacts, etc.

The usable voltages can be further increased by a large number of regions of the second conductivity type between the regions of the first conductivity type, a voltage only being applied in each case to one of these, because through the voltage drop at the individual regions of the second conductivity type, the breakdown voltage is not reached even in the case of a high applied voltage. A similar effect is obtained by large-area regions with a high resistance.

It is particularly advantageous if, there is a large-area region (compared with the regions on the other main surface) of the second conductivity type on one main surface and to which no voltage is applied, the bias at the regions of the first conductivity type in the other main surface being greater than twice the value of the depletion voltage of the semiconductor.

BEST MODE FOR CARRYING OUT THE INVENTION

Figure 1:
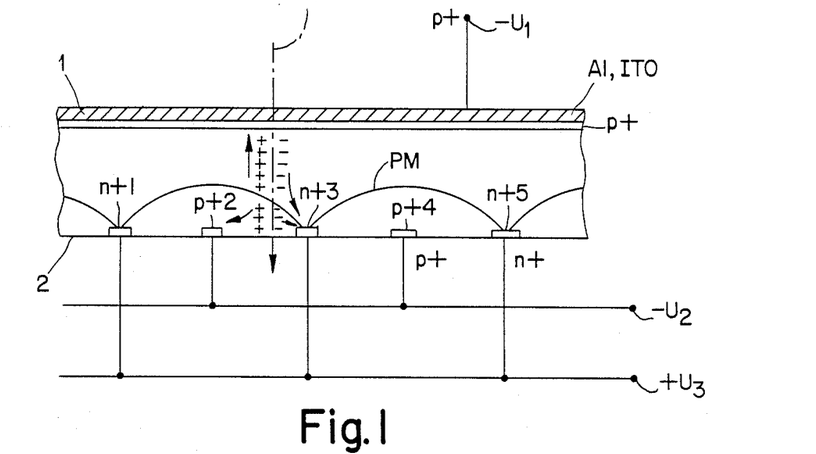
FIG. 1 is a cross-section view through a semiconductor body in accord with a first embodiment of the invention.

FIG. 1 shows a cross-section through a first semiconductor body k of n-conducting silicon with two main surfaces 1 and 2. In the main surface 2 are provided numerous separate regions, which are alternately $p^+$ regions $p+2$, $p+4$, etc. and $n^+$ regions $n+1$, $n+3$, etc. A large-area $p^+$ layer $p+$ with an aluminum or indium-tin oxide (ITO) electrode is placed in the main surface 1. If a voltage $-U2$ is applied to the $p^+$ regions $p+2$, $p+4$, etc., a voltage $U3$ to the $n^+$ regions $n+1$, $n+3$, etc. and a voltage $-U1$ to the large-area $p^+$ region in the main surface 1 and which are in each case so high that the space charge regions are in contact, then the configuration for the potential minimum curve PM for the electrons shown in FIG. 1 is obtained. The potential minimum is not parallel to a main surface of the semiconductor body k and instead passes in curved form from one $n^+$ region to the next. The minimum distance of the potential minimum PM from the main surface 2 is dependent on the voltage ratio U1/U2.

A particle or radiation energy, having a trajectory T1, incident or entering through the main surface 1, in a per se known manner, produces electron/hole pairs. The electrons produced are collected along the potential minimum curve PM and move therealong to the n+ regions, while the holes drift to the p+ regions on the main surface 1 or the main surface 2, as indicated by the arrows.

Both the electron and the two hole signals can be used as information sources for energy, position and/or range of the radiation. In addition, the particles can enter through the main surface 1 or through the main surface 2.

Figure 2:
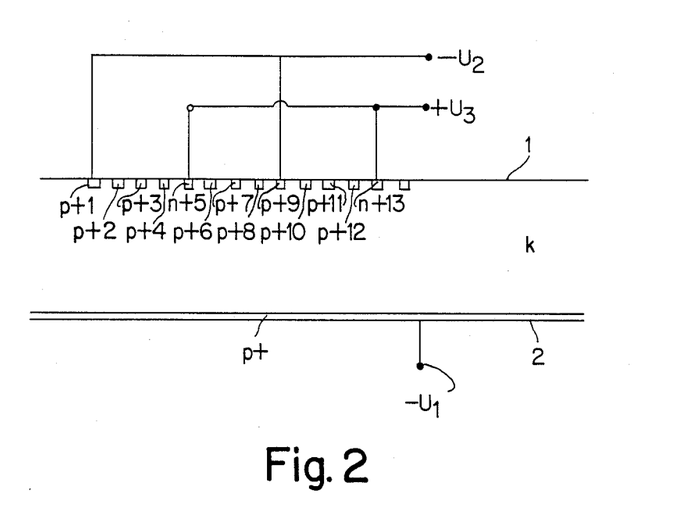
FIG. 2 is a cross-section view through a semiconductor body in accord with a second embodiment of the invention.

FIG. 2 shows a cross-section through a semiconductor body, comprising a second embodiment of the invention, in which between the individual n+ regions n+5, n+13, etc., there are several p+ regions p+1, .., p+4, p+6, ..., p+12, .... Of these p+ regions only the central region is connected to the voltage —U2, so that the $p^{30}$ regions are at different potentials and, so that the breakdown voltage can be increased. The potential strips or rings at a lower potential are simultaneously used for producing a transverse drift field through which the electrons in the potential minimum PM rapidly flow down to the n+ regions.

The number of p+ regions inserted between the individual n+ regions is dependent on the breakdown voltage of the particular basic semiconductor body k. The voltage drop at each individual region, which must be smaller than the breakdown voltage, is a function of the ratio spacing d of the individual regions to the width b of the individual regions.

In the embodiments described in conjunction with FIGS. 1 and 2, electrodes are provided on both main surfaces to which voltages are applied.

Hereinafter embodiments are described, in which no voltages are applied to a main surface, so that said main surface does not have to be contacted.

Figure 3A:
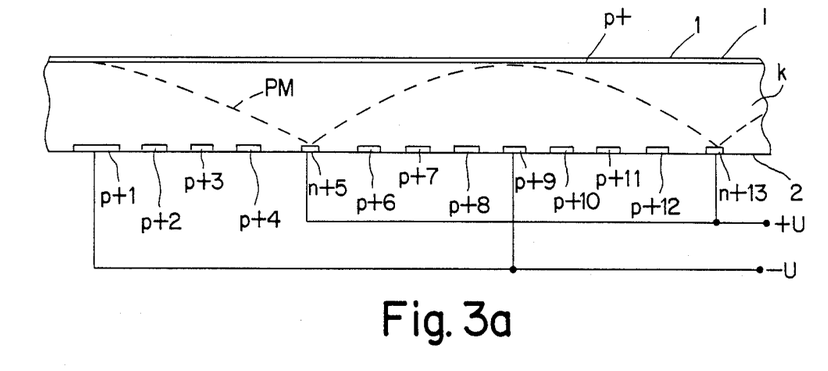
FIGS. 3a and 3b are a cross-section view through a semiconducctor body in accord with a third embodiment of the invention.

FIG. 3a shows a cross-section through a third semiconductor body, comprising another embodiment of the invention, which has a semiconductor body k of n-conducting silicon with two main surfaces 1 and 2. In main surface 2 are positioned a plurality of separate p+ regions p+1, p+2, p+3, ... and n+ regions n+5, n+13, etc. A large-area layer p+ is placed in the main surface 1, is not contacted and has a low surface resistance.

If a sufficiently high voltage difference in the reverse direction is applied between the selected p+ regions p+1, p+9, etc. and the n+ regions n+5, n+13, etc., then in the semiconductor body there is a potential minimum curve PM for the electrons, which almost contacts the main surface 1. The potential minimum does not run parallel to a main surface of the semiconductor body k and instead passes in a curved manner from one n+ region to the next.

The nonconnected p+ regions p+2, p+3, p+4, p+6, p+8, p+10, etc. on the main surface 2 are used for producing a suitable potential gradient in the potential trough. This is possible by a suitable choice of these regions and the spacing between them. The voltage difference between adjacent, unconnected p+ regions is mainly dependent on their spacing and the doping of the semiconductor body. The width of the regions permits a further influencing of the electrical field strength in the potential trough. The maximum number of unconnected p+ regions is given by the condition that the potential trough must only reach the main surface 2 in the connected n+ regions.

A particle or radiation entering, or incident through, the main surface 1 in known manner produces electron/hole pairs. The electrons produced are collected along the potential minimum curve PM and pass therein to the n+ regions, while the holes in each case drift to the p+ regions on the main surface 1 or on the main surface 2.

From main surface 1 the holes drift to the point or points where the potential minimum just contacts the surface to the opposite p+ regions connected to —U2. The holes collected in the unconnected p+ regions of the main surface 2 drift close to the surface to the next connected p+ region.

A corresponding choice of the number and the distance d and width b of the unconnected p+ regions permits an optimization of the charge collection time with respect to the detector capacitance. In the case of a large spacing of the n+ regions, a small capacitance or capacity is obtained, but naturally also a comparatively large charge collection time of the detector and vice versa.

Advantageously, both the electron and the two hole signals can be used as information sources. This is illustrated by a modified embodiment in FIG. 3b where, contrary to FIG. 3a, the p+1 region has a voltage supply —U1 separate from the remaining/connected p+ regions. In the case of a suitable size of the voltages —U1 and —U2, it is possible to ensure that the potential trough only contacts the point of the main surface 1 opposite to the connected p+1 region. The holes flowing to the main surface can consequently only pass at this point out of the main surface 1 and drift to the p+1 electrode. It is therefore possible to differentiate short range radiation from long range radiation. Short range radiation passing through the main surface 1 and absorbed between main surface 1 and the curve PM only supplies a hole signal on main surface 1 and consequently at the p+1 region. Short range radiation also produces holes between the potential minimum and the main surface 2. As the latter pass to the connected p+ regions in the main surface 2, they supply a second hole signal. Short and long range radiation can be easily differentiated in that either only one hole signal is recorded at p+1 or two hole signals are recorded at p+1 and the other connected p+ regions. The same applies when radiation enters through main surface 2.

Figure 3B:
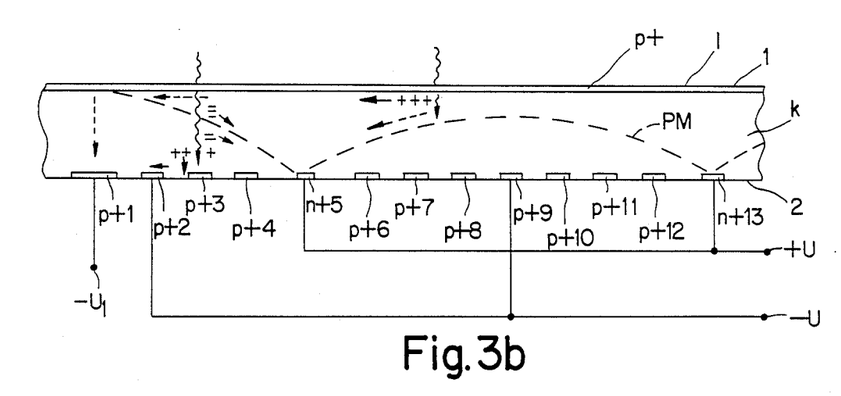

The semiconductor arrangement shown in FIG. 3 has the following advantages compared with the semiconductor detectors or their operating mode described in conjunction with FIGS. 1 and 2.

First, there is no contacting of the main surface required. As a result, not only is it possible for the semiconductor arrangement to be positioned directly adjacent to the measuring arrangement, but the detector is more sensitive through the electrode on the main surface 1 for the radiation entering through this main surface. The manufacturing expenditure is also reduced.

Secondly, between the diode formed by the large-area region p+ and the semiconductor body k and the adjacent, undepleted semiconductor body k, there is only a very small or no voltage difference in the border zones of the arrangement. Thus, in certain circumstances, it is possible to implant the large-area region p+ in large-area manner without photolithography.

Thirdly, the capacity of the arrangement is also smaller than the already small capacity of the arrangements with a connected main surface 1, because the total capacity is obtained as a series connection of the small capacity between the n+ regions and the main surface 1 and the capacity between the connected p+ regions and the main surface 1.

Figure 4:
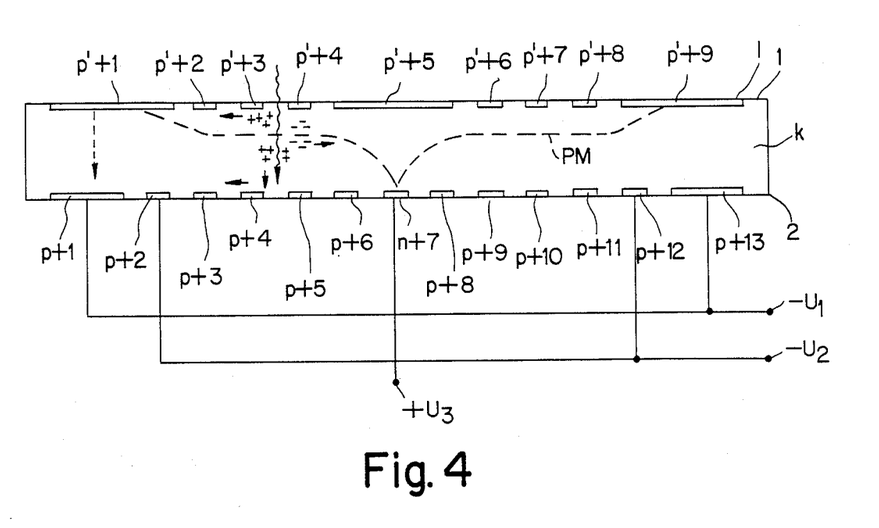
FIG. 4 is a cross-section view through a semiconductor body in accord with a fourth embodiment of the invention.

FIG. 4 shows a fourth embodiment of the invention, where a large-area region p+ with low surface resistance is replaced by a plurality of regions p'+1, p'+2, p'+3 etc. in the main surface 1. Region p'+1, facing region p+1, in the main surface 2 has a greater width b' than the region p+1. Due to the large number of regions p'+ provided in the main surface 1, the difference of the voltages −U2 and +U3 can be greater than in the embodiment shown in FIG. 1, because regions p'+2, p'+3, etc. have the function of a voltage divider.

Thus, the curve PM from the p'+1 region is forced into the semiconductor body k and passes at a clearly defined depth parallel to the main surfaces and only just prior to the next connected n+ region does it bend down towards it. Due to the potential differences at the p+ regions in the main surface 1 and 2, a transverse drift field is produced, so that electrons formed at any point by incident radiation and drifting into the potential trough, drift further therein to the n+ regions. The holes behave correspondingly, the holes running to the main surface 1 pass into the p'+1 region and from there to the p+1 region. However, the holes drifting to the main surface 2 pass to the next connected p+ region. If the p+1 and p+2 regions are provided with separate voltage supplies, as described in FIG. 1b, the two hole signals can be separately read out again, so that it is once again possible to discriminate between radiation of different ranges. While the embodiment of FIG. 1b has the advantage that only a large-area p+ region is provided in the main surface 1, the advantage of the embodiment according to FIG. 2 is that an exact discrimination of the radiation is possible over a longer distance due to the surface-parallel configuration of the potential minimum. Another advantage is that the point of incidence of the radiation can be determined via the drift time of the electrons. Thus, such a radiation detector permits the following simultaneous measurements: determination of the radiation energy, determination of the point of incidence and discrimination between radiation of different ranges. Furthermore, the capacitance of this arrangement is lower, because the distances between the connected p+ and n+ regions are greater. It is also possible to capacitively read out the holes passing to the p+ regions, so that further position information can be obtained. If the p+2 region is not connected to an external voltage, then the holes of both main surfaces drift into the p+1 region.

Figure 5:
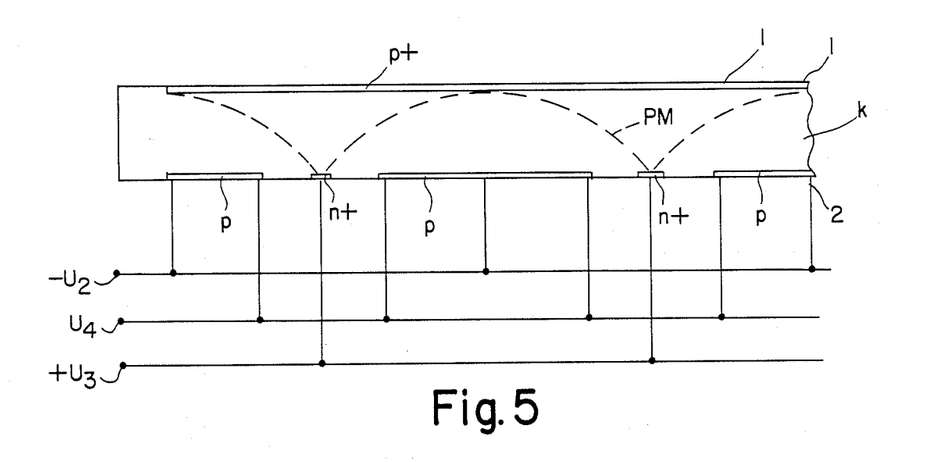
FIG. 5 is a cross-section view through a semiconductor body in accord with a fifth embodiment of the invention.

FIG. 5 shows a fifth embodiment of the invention, in which the main surface 2 has large-area p+ regions with a large surface resistance. Voltages U4 and −U2 are applied thereto and voltages +U3 to the interposed n+ zones. These voltages fulfil the relationship

U3 > U4 > −U2.

Thus the large-area region in the main surface 1 is set to a voltage U5, for which the following applies:

U3 > U5 > −U2.

A possible advantage of this arrangement is that high demands are not made on the photolithography quality in producing the large-area p+ regions. In addition, the configuration of the curve PM can be influenced by the applied voltages −U2 and U4.

Figure 6:
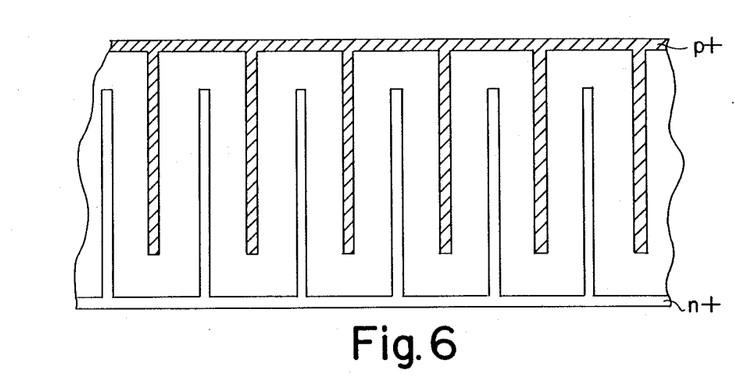
FIGS. 6–9 are varied arrangements of the $n^+$ and $p^+$ regions.

In the aforementioned embodiments described in exemplified manner, for reasons of simplicity the individual regions in the main surface 2 are shown as strip-like regions. The p+ and n+ regions on the main surface 2 can, as shown in FIG. 6, also be arranged in comb-like manner. The comb-like arrangement simplifies the contacting of the individual regions.

Figure 7:
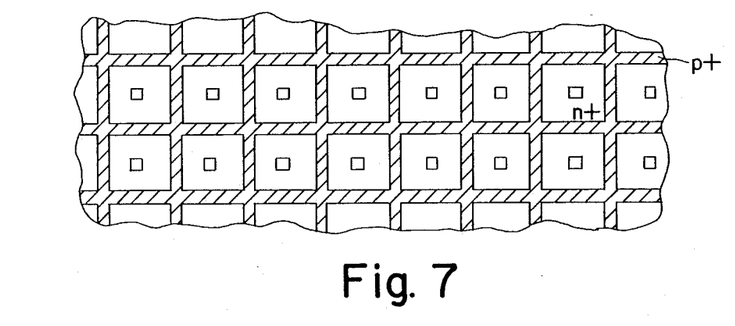

Furthermore and as shown in FIG. 7, the n+ regions can be completely surrounded by the p+ regions. As shown in FIG. 7, the p+ regions can have a rectangular shape, but can also have a honeycomb shape, etc.

The punctiform arrangement of the n+ regions leads to a further reduction in the capacitance. Furthermore, two-dimensional position information can be obtained through a separate readout of the individual regions.

Figure 8:
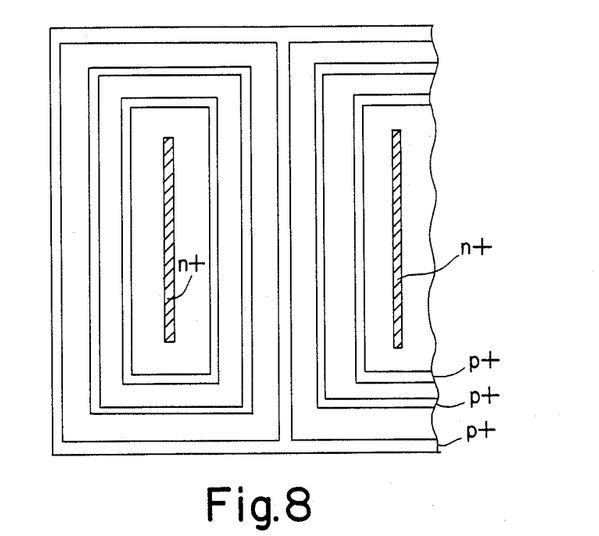
Figure 9:
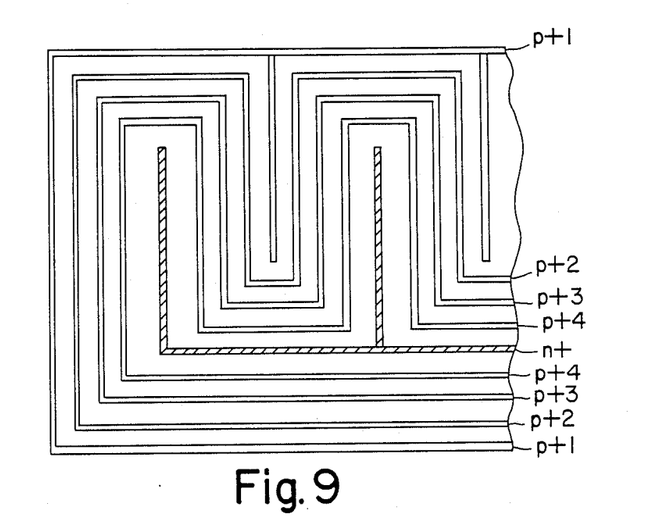

FIGS. 8 and 9 show further possible geometries of the p+ n+ regions, in which the border zones of the detector are at the same potential.

In the aforementioned embodiments, it is obviously possible for the n+ and p+ regions connected in the main surface to be subject to the action of different voltages. It can in particular be advantageous to separately read out both the individual n+ regions and the p+ regions, so that additional position information of the measured radiation is possible.

Figure 10:
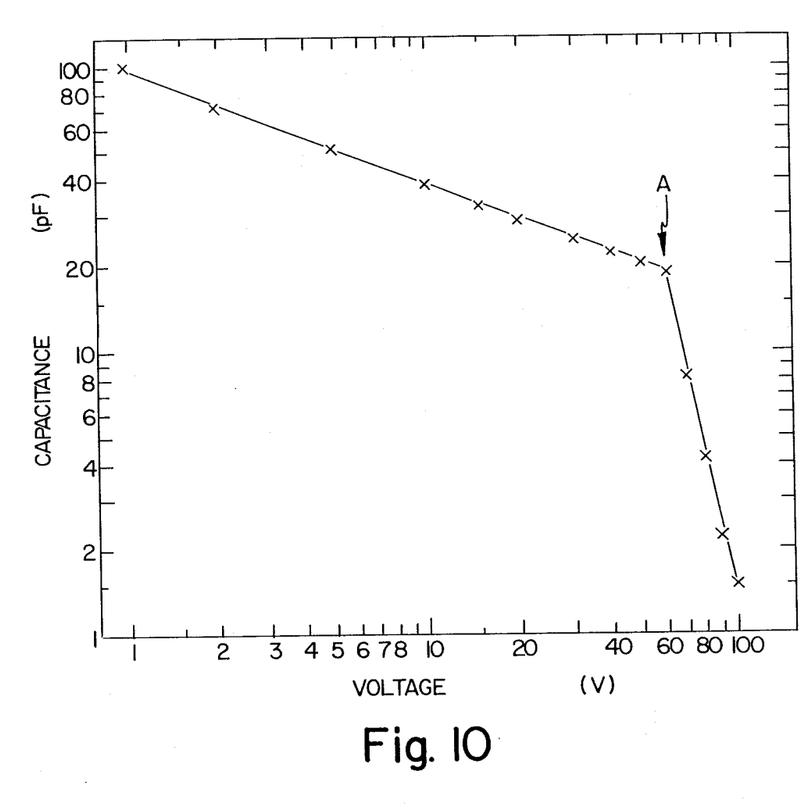
FIG. 10 is a voltage/capacitance characteristic curve for an element produced in practice of the invention.

FIG. 10 shows the dependence of the capacitance of the large-area semiconductor arrangement or detector on the bias, i.e. the voltage between the connected n+ and p+ regions. Semiconductor body k comprises a n-silicon chip with a surface of 1 cm$^2$, of orientation 111 and specific resistivity approximately 4 k$\Omega$cm. The chip thickness is approximately 250 $\mu$m. The arrangement of the p$^{30}$ and the n+ regions on the contacted side corresponds to what is shown in FIG. 8, there being in each case 12 p+ regions between individual n+ regions. FIG. 10 clearly shows the start of depletion of semi-conductor body k at point A of the characteristic line.

It has been assumed in the above description that the semiconductor body k is n-doped and that the regions of the second conductivity type are p-conducting. It is naturally possible to interchange the p and n regions. In per se known manner, in place of pn structures, it is also possible to use surface depletion layers without Schottky junctions and also heterogeneous semiconductor structures.

It is finally also possible to use MIS contacts (metal—insulator—semiconductor contacts) and in particular MOS contacts. In place of planar semiconductors, it is also possible to use hollow cylindrical or spherical arrangements.

Furthermore, in arrangements where voltages are only applied to one main surface, it is also possible to obtain an inversion layer on the other main surface in the case of a p-silicon semiconductor body through simply oxidizing said main surface. Inversion layers can also be obtained with n and p-conducting semiconductor bodies by MOS contacts and the like.

We claim:

1. A detector for detecting hole-electron pairs produced by radiation into a semiconductor material comprising,
   a semiconductor body of a first conductivity type with opposed, parallel main surfaces, semiconductor surface regions of a second conductivity type disposed on said opposed main surfaces capable of forming lateral depletion layers through the semiconductor body, the surface regions of the second conductivity type having a large area region on one main surface with a low surface resistance compared to surrounding regions and reversed biased p—n junction zones on the other main surface, first and second electrode means connected to both of the main surfaces for reverse biasing the semiconductor body with respect to the surface regions of the second conductivity type to the extent that the body is substantially completely depleted of majority carriers, the reverse bias creating a potential minimum in the body, spaced away from the main surfaces, third electrode means, coacting with the first and second electrode means, for forming a potential gradient throughout the semiconductor body for sweeping one of the majority and minority carriers, produced by radiation, out of the body, into one of said electrode means, the other of the majority and minority carriers moving away from the potential gradient toward another of said electrode means, and means for measuring the amount of swept carriers in said electrode means.

2. The detector of claim 1 wherein said first and second electrode means are on the same side of said semiconductor body.

3. The detector of claim 1 wherein fourth and fifth electrode means are on opposite sides of said semiconductor body, symmetric in position and function to the first and second electrode means.

4. The detector of claim 1 wherein said p—n junction zones are disposed in comb-like manner.

5. The detector of claim 1 wherein said p—n junction zones are disposed in meander-like manner.

6. The detector of claim 1 wherein said p—n junction zones comprise a plurality of regions of the first conductivity type surrounded by contiguous regions of the second conductivity type.

7. A low capacitance semiconductor detector for radiation and energetic particles generating hole-electron pairs in semiconductor materials, the detector of the type having a semiconductor body of a first conductivity type with opposed parallel main surfaces to which is applied at least one collecting electrode for carriers and regions of a second conductivity type on both main surfaces of the body, forming depletion layers in the body, the improvement comprising bias means for depleting the body of carriers, the biasing of the body being such as to form a potential gradient, and reverse biased p—n junctions are provided on two main surfaces of the body, said bias on said p—n junctions being sufficient to create a potential minimum, the potential gradient acting upon the potential minimum sweeping carriers formed by incident radiation and energetic particles to a collecting electrode.

8. The semiconductor detector of claim 7, characterized in that further regions of the second conductivity type to which no voltages are applied are inserted between the regions of the first conductivity type and the second conductivity type to which voltages are applied.

9. The semiconductor detector of claim 7, characterized in that the zones of the first conductivity type and the regions of the second conductivity type are inserted in comb-like manner in one another.

10. The semiconductor detector of claim 7, characterized in that a plurality of regions of the first and second conductivity types are inserted in one another in meander-like manner.

11. The semiconductor detector of claim 7, characterized in that on the main surface on which are provided zones of the first conductivity type is provided at least one large-area region of the second conductivity type with a clearly defined surface resistance.

12. A low capacitance semiconductor detector for radiation and energetic particles generating hole-electron pairs in semiconductor materials, the detector of the type having a semiconductor body of a first conductivity type with opposed parallel main surfaces and regions of a second conductivity type on both main surfaces of the body, characterized in that, on both of the two main surfaces between the regions of the second conductivity type are provided zones of the first conductivity type, having reverse bias means with respect to regions of the second conductivity type, for forming depletion zones for carriers with a characteristic potential minimum, and electrode means connected to surface regions for forming a potential gradient in said body and across said potential minimum thereby sweeping carriers from said body.

* * * * *